United States Patent [19]

Costes et al.

[11] 4,101,743
[45] Jul. 18, 1978

[54] TEST CIRCUIT FOR A PROTECTIVE COUPLER

[75] Inventors: Michel Leon Costes; James Franklin Hoyle, both of Raleigh, N.C.

[73] Assignee: International Business Machines Corporation, Armonk, N.Y.

[21] Appl. No.: 803,837

[22] Filed: Jun. 6, 1977

[51] Int. Cl.² .......................................... H04M 3/26
[52] U.S. Cl. ................................. 179/175; 324/158 R
[58] Field of Search ............ 179/175, 175.1, 175.1 A, 179/175.2 R, 175.3, 175.31, 1 MN, 2 C, 1 C; 307/200 A, 264; 324/158 R

[56] References Cited

U.S. PATENT DOCUMENTS

| 3,508,144 | 4/1970 | Mayer | 179/175.3 |
| 3,725,613 | 4/1973 | Allen et al. | 179/175.3 |
| 3,736,387 | 5/1973 | Thompson et al. | 179/175 |
| 3,773,986 | 11/1973 | Tremblay | 179/175.3 R |
| 4,002,861 | 1/1977 | Putt | 324/158 R |
| 4,020,298 | 4/1977 | Epley et al. | 179/175 |

Primary Examiner—Kathleen Claffy
Assistant Examiner—Gerald L. Brigance
Attorney, Agent, or Firm—John B. Frisone

[57] ABSTRACT

The test circuit disconnects the active elements of the coupler from the input and output and applies a test signal to the input of the active elements. The output of the active elements is first compared with a first threshold which if exceeded or equaled provides a first indication. Within a predetermined time period the output of the active elements is compared with a second threshold to determine if the control function of the active element has reduced the input to the second threshold within the time period. If this condition prevails, the indication previously provided is removed; otherwise, the indication remains and a faulty coupler is indicated.

5 Claims, 2 Drawing Figures

U.S. Patent   July 18, 1978   4,101,743

TEST CIRCUIT FOR A PROTECTIVE COUPLER

BACKGROUND OF THE INVENTION

1. Field of the Invention

The invention relates to protective circuits in general and more particularly to a testing arrangement in which the efficacy of a protective circuit can be tested.

2. Description of the Prior Art

Protective coupling circuits for connecting a modem or data set to a public switched network are known in the art. These circuits limit the output voltage applied to the network regardless of the value of the input voltage within a predetermined time. The circuits generally use a program or standard resistor which when connected to a regulated voltage supply provides a reference voltage which is used for operating the circuits. Circuits of this type have not in the past been provided with on-line testing arrangements by which an operator can determine the efficacy of the circuit. Generally, the circuits have been removed from the operative environment and bench tested to determine whether or not they are functioning properly. This arrangement is both costly and inconvenient since it generally requires substitution and later test. When difficulty occurs in a communication path which may include a large variety of equipment such as business machines, modems, data sets and switched network facilities, as well as the protective coupling devices, it is incumbent to readily determine which of the devices in the end-to-end connection are malfunctioning. Removal of a device with either substitution or bench testing is not a practical solution.

SUMMARY OF THE INVENTION

The invention contemplates a test circuit for use with a protective coupler for coupling a modem to a switched network and for simultaneously limiting the maximum signal voltage applied to the network to a specified value and comprises first switching means for disconnecting the coupler from the modem and the network and for applying a voltage substantially in excess of the allowable network voltage to the input of the coupler, circuit means for generating first and second thresholds T1 and T2 corresponding respectively to the maximum allowable signal voltage level permitted in the network and to the voltage applied to the coupler by the first switching means, an electrically operated indicator, a first normally closed and a second normally open switch means serially connected for connecting the indicator to a power source, first comparator means responsive to T2 and to the coupler output for providing an output to the second normally closed switch means for energizing the indicator when the coupler output equals or exceeds T2 and a second comparator means responsive to T1, the coupler output and the prior energization of said indicator within a predetermined time period for providing an output signal to energize said first normally closed switch means to open which causes deenergization of the indicator when the coupler output is equal to or less than T1 within the above said predetermined time period following energization of the indicator.

DESCRIPTION OF THE PREFERRED EMBODIMENT

Figure 1:
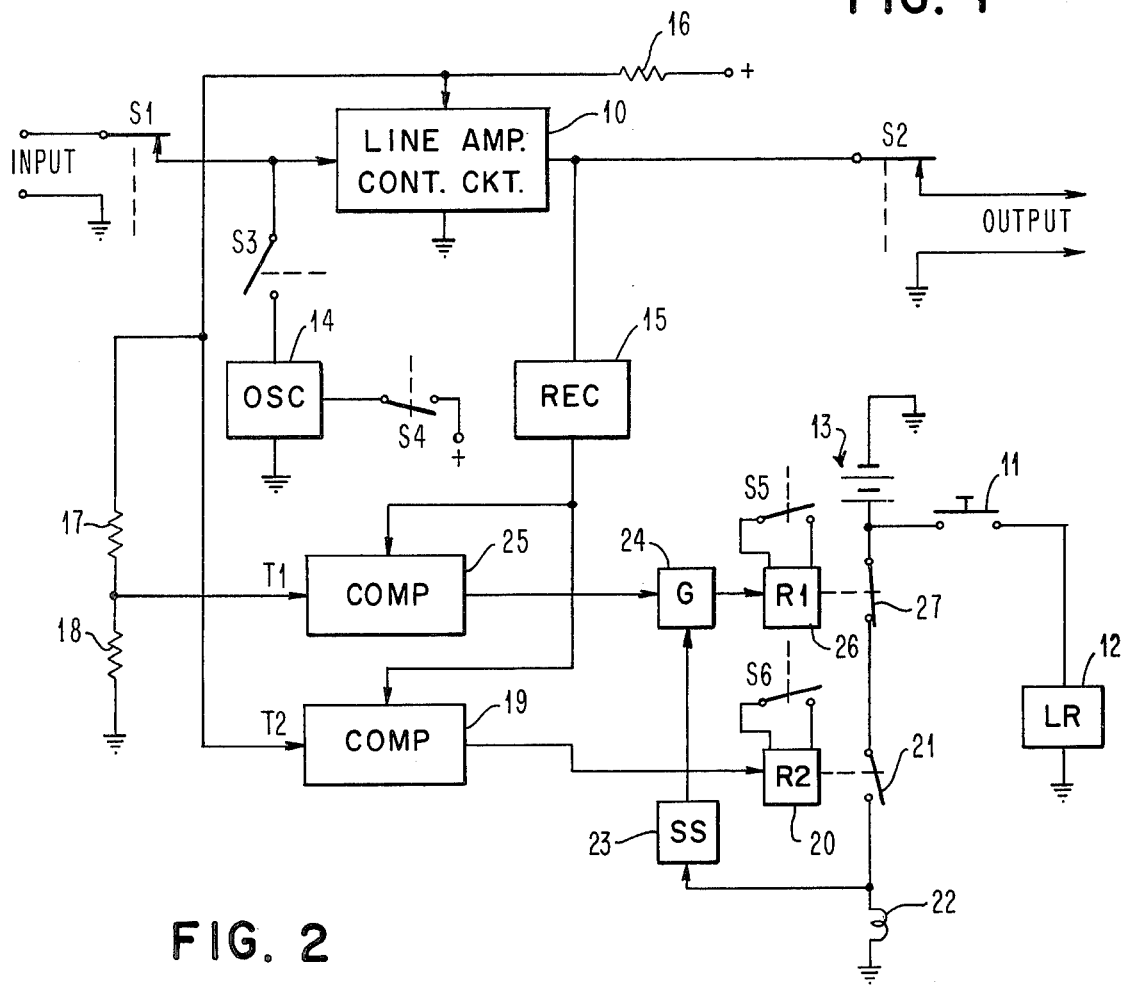
FIG. 1 is a block schematic diagram of a testing circuit and a protective line coupler connected between a modem output and a network input.

In FIG. 1 a conventional line amplitude control circuit 10 is connected between a modem not shown via a switched contact S1 and a network not shown by a switched contact S2. A pushbutton switch 11 connects a relay 12 to a power supply 13 when actuated and held. Relay 12 is provided with six contacts, S1 and S2 previously described, and S3–S6 to be described below. These contacts are shown in the drawing in their normal position, i.e., with relay 12 deenergized. When the relay 12 is energized, the contacts assume the opposite position from that illustrated in the drawing.

When pushbutton switch 11 is actuated and held closed, relay 12 is energized, switch contacts S1 and S2 open, thus disconnecting the line amplitude control circuit 10 from the modem and the switched network. At this time switch contacts S3 and S4 close. This applies power to an oscillator 14 and connects the oscillator output to the input of the amplitude control circuit 10. The signal from oscillator 14 is approximately +12 dB over the maximum allowable voltage on the network. The output of amplitude control circuit 10 is applied to a rectifier 15 which provides a DC level at its output, the voltage of which is comparable to the maximum voltage permitted on the network.

Resistors 16, 17 and 18 connected between a positive voltage source and ground form a voltage divider network. The voltage source is regulated, thus the voltage appearing between resistors 16 and 17 is used to control circuit 10 and provide a threshold voltage T2 while the voltage at the point between resistors 17 and 18 provides a threshold voltage T1. Resistors 16, 17 and 18 are selected such that the reference voltage T2 is approximately 11 dB over the maximum allowable voltage level on the network while T1 is 1 dB over the said maximum level. Threshold T2 is applied to one input of a comparator 19 along with the output of rectifier 15. Comparator 19 provides a suitable output for energizing a latching relay 20 when the output of the rectifier 15 is equal to or greater than the threshold T2. When this condition prevails, relay 20 latches and closes an associated normally open switch 21. A contact S6 of relay 12 which is normally open is used to release the latch on relay 20 when pushbutton 11 is released by the operator. As soon as contact 21 closes, a lamp 22 is connected to power source 13 and is illuminated thus indicating to the operator the beginning of the test. A single shot circuit 23 starts a timeout as soon as switch contact 21 closes and provides an output for a finite period of time, approximately 6 seconds, to a gate circuit 24. A second comparator 25 connected to T1 and the output of rectifier 15 provides an output whenever the rectified output signal from rectifier 15 is equal to or less than T1. This output is applied to gate 24. If the output occurs within the timeout of single shot circuit 23, it passes gate 24 and actuates a latching relay 26 which is similar to relay 20 described above. This relay is released by contact S5 of relay 12 when pushbutton switch 11 is opened. When relay 26 is actuated and latches, a contact 27 opens thus interrupting the energization of lamp 22. If the circuit 10 does not reduce the amplitude of the signal applied via oscillator 14 within the six second period, contact 27 does not open. Thus, the lamp remains lit indicating a circuit failure to the operator. If lamp 22 extinguishes, the circuit is considered functioning properly.

Figure 2:
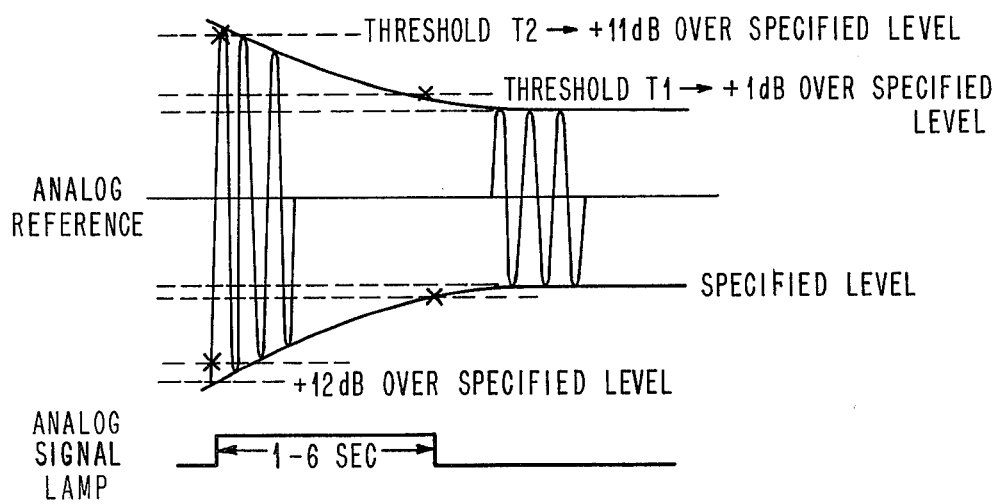
FIG. 2 is a graph illustrating the signal levels described in conjunction with FIG. 1.

The graph illustrated in FIG. 2 shows the normal function of the line amplitude control circuit 10 as a function of voltage in response to an application of the output of oscillator 14. The signal from oscillator 14 is 12 dB over the specified maximum level for the network. Within the period of 1-6 seconds the circuit must reduce the amplitude to no more than 1 dB over the specified voltage level. The first test, i.e., the output of comparator 19, is to determine that the circuit is functioning and providing an output comparable to the input at the earliest time period. The second test, i.e., the output of comparator 25, within the time period specified by the single shot circuit 23, is to determine that within the six second period of single shot circuit 23 the output of the amplifier is within the 1 dB limit of the specified voltage level, thus from the operator's point of view very shortly after the button is pushed, the light comes on and within six seconds the light goes out. If the light 22 does not perform in this manner abnormal operation of the line amplitude control circuit 10 is indicated.

While the invention has been particularly shown and described with reference to preferred embodiments thereof, it will be understood by those skilled in the art that various changes in form and details may be made therein without departing from the spirit and scope of the invention.

What is claimed is:

1. A test circuit for use with a protective coupler used for coupling an output signal from a modem to a switched network and for limiting the maximum signal voltage applied to the network to a specified value comprising:

first switch means for disconnecting the coupler from the modem output and the network and for applying a signal having a voltage substantially in excess of the allowable network voltage to the input of the coupler, circuit means for generating a first threshold voltage T1 corresponding to the maximum allowable signal voltage level permitted on the network and a second threshold voltage T2 corresponding to the signal voltage level applied by the first switching means to the coupler input, an electrically operated indicator, a first normally closed switch means and a second normally open switch means for connecting said indicator to an electric power source, first comparator means responsive to the second threshold T2 and to the protective coupler output for providing an output to said second normally open switch means for causing said switch means to close and energize said indicator when the coupler output equals or exceeds T2, and second comparator means responsive to the first threshold T1, the coupler output and the energization of said indicator for providing an output signal to said first normally closed switch means for causing said switch means to open and deenergize said indicator when said coupler output is equal to or less than T1 within a predetermined time period following the energization of the indicator.

2. A test circuit as set forth in claim 1 in which said second comparator means includes a comparison circuit for comparing the output from said protective coupler and T1 and for providing an output suitable for operating said first normally closed switch means, a gate circuit for passing said output when properly conditioned, and a single shot circuit responsive to energization of the indicator for providing a conditioning output to said gate circuit for a predetermined period following energization of said indicator.

3. A test circuit as set forth in claim 2 in which said threshold voltages T1 and T2 are d.c. voltages and the protective coupler output is rectified to d.c. before comparison with T1 and T2.

4. A test circuit as set forth in claim 3 in which the signal voltage applied to the coupler by the first switch means, T1 and T2 are 12 dB, 1 dB and 11 dB over the maximum allowable voltage on the network, respectively.

5. A test circuit as set forth in claim 4 in which the circuit means for generating T1 and T2 includes a resistive voltage divider network connected to a regulated voltage source provided with voltage taps for T1 and T2 which are respectively, 1 and 11 dB over the maximum allowable signal voltage on the network.

* * * * *